(12) United States Patent
Hamon et al.

(10) Patent No.: US 6,677,737 B2
(45) Date of Patent: Jan. 13, 2004

(54) VOLTAGE REGULATOR WITH AN IMPROVED EFFICIENCY

(75) Inventors: Cécile Hamon, Grenoble (FR); Christophe Bernard, Claix (FR); Alexandre Pons, Grenoble (FR)

(73) Assignee: STMicroelectronics S.A., Montrouge (FR)

(\*) Notice: Subject to any disclaimer, the term of this patent is extended or adjusted under 35 U.S.C. 154(b) by 88 days.

(21) Appl. No.: 10/052,209

(22) Filed: Jan. 16, 2002

(65) Prior Publication Data
US 2002/0125866 A1 Sep. 12, 2002

(30) Foreign Application Priority Data
Jan. 17, 2001 (FR) .............................................. 01/00597

(51) Int. Cl.$^7$ ................................................. G05F 1/44
(52) U.S. Cl. ........................................ 323/280; 323/275
(58) Field of Search ................................ 323/273, 274, 323/275, 280, 281, 312, 313, 314

(56) References Cited
U.S. PATENT DOCUMENTS
5,528,127 A  6/1996  Streit ........................... 323/269
5,828,502 A  10/1998  Afshari ........................ 359/819
6,150,798 A  11/2000  Ferry et al. .................. 323/273
6,362,609 B1 * 3/2002  Gailhard ..................... 323/280

FOREIGN PATENT DOCUMENTS
EP  0 930 688 A2  7/1999
GB  2 260 625 A   4/1993

\* cited by examiner

*Primary Examiner*—Jessica Han
(74) *Attorney, Agent, or Firm*—Lisa K. Jorgenson; Robert Iannucci; Seed IP Law Group PLLC

(57) ABSTRACT

A voltage regulator having an output terminal provided for being connected to a load, including an amplifier having its inverting input connected to a reference voltage, and its non-inverting input connected to the output terminal, a charge capacitor arranged between the output terminal and a first supply voltage, first and second voltage-controlled switches each arranged to connect a second supply voltage and the output terminal, and a control means adapted to providing a voltage depending on the output voltage of the amplifier, on the one hand, to the gate of the first switch and, on the other hand, when the current flowing through the first switch reaches a predetermined threshold, to the gate of the second switch.

13 Claims, 3 Drawing Sheets

VOLTAGE REGULATOR WITH AN IMPROVED EFFICIENCY

BACKGROUND OF THE INVENTION

1. Field of the Invention

The present invention relates to the field of voltage regulators and in particular to that of regulators with a low drop out.

2. Description of the Related Art

A low drop out (LDO) regulator made in the form of an integrated circuit may be used to provide, with low noise, a predetermined voltage to a set of electronic circuits from a supply voltage provided by a rechargeable battery. Such a supply voltage decreases in time and is likely to include noise due for example to the action of neighboring electromagnetic radiations on the battery-to-regulator connections. The regulator is said to have a low drop out since it provides a voltage close to the supply voltage.

FIG. 1 schematically shows a conventional low-drop out regulator. The regulator includes an output terminal O intended for being connected to a load R. Load R, essentially resistive, represents the input impedance of the set of the circuits supplied by the regulator. For simplicity, it is considered hereafter that load R is a resistor. The regulator includes an operational amplifier 2 having an inverting input $IN^-$ connected to a positive reference voltage Vref and having a non-inverting input $IN^+$ connected to terminal O by a feedback loop. Voltage Vref is generated in a known manner by a constant voltage source (not shown) with a high output impedance. Amplifier 2 is supplied between a positive supply voltage Vbat provided by the battery and a ground voltage GND. The output of amplifier 2 is connected to the gate of a P-channel MOS power transistor T1 having its drain connected to output terminal O and its source connected to voltage Vbat. Transistor T1 is of MOS rather than bipolar type, especially to minimize the difference between output voltage Vout of terminal O and supply voltage Vbat. A charge capacitor C is arranged between output terminal O and voltage GND.

The regulator maintains voltage Vout of output terminal O to a value equal to reference voltage Vref. Any variation in voltage Vbat translates as a variation in voltage Vout, which is transmitted by the feedback loop on input $IN^+$. When the regulator operates properly, the variation in the voltage of terminal $IN^+$ causes the return of voltage Vout to voltage Vref. For this purpose, the regulator circuit, which forms a looped system between input $IN^+$ and terminal O, must form a stable system. For this system to be stable when looped, its open-loop gain must not exceed 1 when the phase shift is smaller than $-180°$ (phase opposition between the system input and output).

FIG. 2 illustrates, according to frequency f, the variation in gain G and in phase shift $\phi$ of the open-loop regulator between input $IN^+$ and terminal O. For low frequencies f, gain G is equal to static gain Gs of the open-loop regulator. The elements forming the regulator each have a gain which varies according to frequency. The cut-off frequency of an element having a gain that decreases as the frequency increases corresponds to a "pole" of the transfer function of the open-loop regulator. Each pole of the transfer function of the open-loop regulator introduces a drop by 20 dB per decade in gain G. Further, each pole of the transfer function of the open-loop regulator introduces a phase shift $\phi$ by $-90°$. For simplicity, it is considered hereafter that the transfer function of the open-loop regulator only includes one main pole P0 and one secondary pole P1. The frequency of main pole P0 especially depends on the inverse of the product of the values of load resistance R and of capacitance C. The frequency of secondary pole P1 especially depends on the gate impedance of transistor T1. The features of the elements forming the regulator are chosen so that, when phase shift $\phi$ becomes equal to $-180°$, gain G is smaller than 1 (0 dB). In FIG. 2, pole P0 is at a low frequency, pole P1 is at a greater frequency than pole P0. For a frequency smaller than the frequency of pole P0, the gain is equal to static gain Gs of the open-loop regulator. Between poles P0 and P1, the gain drops by 20 decibels per decade. Beyond pole P1, the gain drops by 40 decibels per decade. The phase shift drops from 0 to $-90°$ at pole P0 and from $-90°$ to $-180°$ at pole P1.

The voltage regulator provides a current IO to load R, while maintaining output terminal O to reference voltage Vref. For the regulator to be able to provide a strong current IO, transistor T1 must be large. As a result, the gate capacitance of transistor T1 is high. The output impedance of amplifier 2 is small to be able to control the gate of transistor T1. The current IA consumed by amplifier 2 depends on the output impedance of amplifier 2 and is high. The efficiency of the voltage regulator depends on ratio IO/(IA+IO). Thus, the efficiency of a conventional regulator is low when current IO is low, for example, when the circuits supplied by the regulator are in a stand-by mode. Many electronic appliances supplied by a rechargeable battery, such as cellular phones, must be able to remain in stand-by mode for a long time. A conventional voltage regulator is poorly adapted to such appliances.

A conventional way of increasing the regulator efficiency consists of increasing the output impedance of amplifier 2 to reduce current IA consumed by amplifier 2. However, the value of static gain Gs of the regulator is in particular proportional to output impedance Zout of the amplifier. A strong output impedance Zout makes static gain Gs high and shifts the secondary pole towards low frequencies, which respectively shifts the gain curve upwards and the phase curve to the left and makes the regulator stability difficult to obtain. FIG. 2 illustrates as an example gain and phase curves G' and $\phi'$ of an open-loop regulator having previous pole P0, having a secondary pole at a frequency P1' smaller than previous frequency P1, and having a static gain Gs' greater than previous static gain Gs. Gain G' is greater than 1 (0 dB) when phase shift $\phi'$ reaches $-180°$, which makes the regulator unstable.

BRIEF SUMMARY OF THE INVENTION

An embodiment of the present invention is to provide a voltage regulator having a high efficiency.

To achieve this embodiment, as well as others, the present invention provides a voltage regulator having an output terminal connected to a load, including an amplifier having its inverting input connected to a reference voltage, and its non-inverting input connected to the output terminal, a charge capacitor arranged between the output terminal and a first supply voltage, first and second voltage-controlled switches each arranged to connect a second supply voltage and the output terminal, and a control means adapted to provide a voltage depending on the output voltage of the amplifier to the gate of the first switch and, when the current flowing through the first switch reaches a predetermined threshold, to the gate of the second switch.

According to an embodiment of the present invention, the current running through the first switch is smaller than or equal to said predetermined threshold.

According to an embodiment of the present invention, the amplifier is supplied between the first supply voltage and the second supply voltage.

According to an embodiment of the present invention, the first and second voltage switches are MOS transistors of a first type, the gate of the second switch being wider than the gate of the first switch.

According to an embodiment of the present invention, the control means includes first and second impedances, a first terminal of each impedance being connected to the second supply voltage, first and second bipolar transistors having their collectors connected to a second terminal respectively of the first and second impedances, and to the gates respectively of the first and second switches, the base and the collector of the first transistor being interconnected, the base of the second transistor being connected to the first supply voltage via a current source, a third MOS transistor of a second type arranged to connect the emitters of the first and second transistors to the first supply voltage, the gate of the third transistor being connected to the amplifier output, and a fourth diode-connected MOS transistor of the first type, arranged to connect the base of the second transistor to the second supply voltage.

According to an embodiment of the present invention, the first and second switches and the fourth transistor are P-channel MOS transistors, the first and second bipolar transistors are of NPN type, and the third transistor is an N-channel MOS transistor. The foregoing embodiments, features and advantages of the present invention will be discussed in detail in the following non-limiting description of specific embodiments in connection with the accompanying drawings.

DETAILED DESCRIPTION OF THE INVENTION

Figure 3:
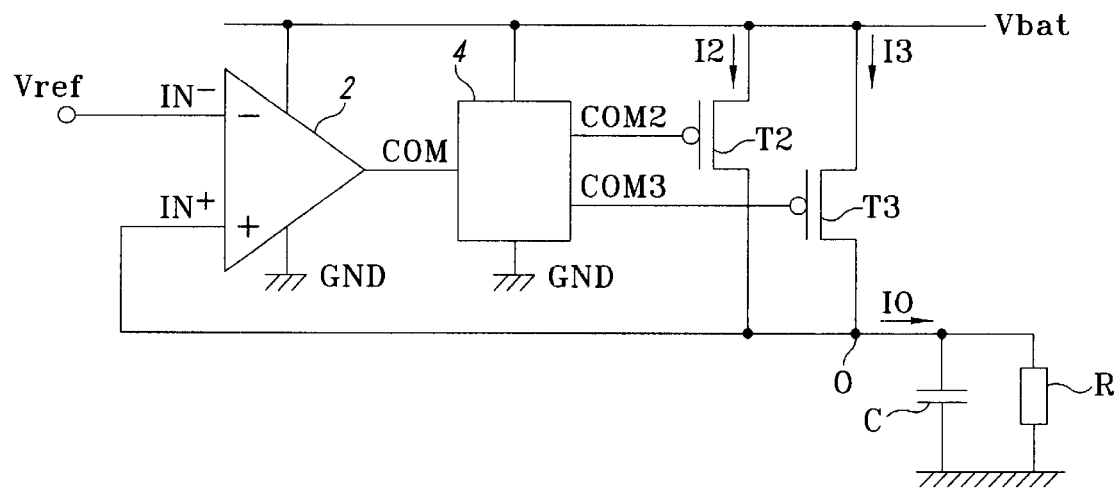
FIG. 3 schematically shows a voltage regulator according to the present invention.

FIG. 3 schematically shows an embodiment of a voltage regulator according to the present invention. The regulator includes an output terminal O connected to a load R and to a capacitor C. The regulator includes an amplifier 2 supplied between a voltage Vbat and a voltage GND. The inverting and non-inverting inputs IN⁻ and IN⁺ of amplifier 2 are respectively connected to a positive reference voltage Vref and to terminal O. According to the present invention, the voltage regulator includes P-channel power MOS transistors T2 and T3, having their respective drains connected to output terminal O and their respective sources connected to supply voltage Vbat. The output current IO is equal to the sum of the currents through the transistors, T2 and T3 so that: I2+I3=IO. The voltage regulator further includes a control means 4 having an input terminal COM connected to the output of amplifier 2, and first and second output terminals COM2, COM3 respectively connected to the gates of transistors T2 and T3.

Figure 4:
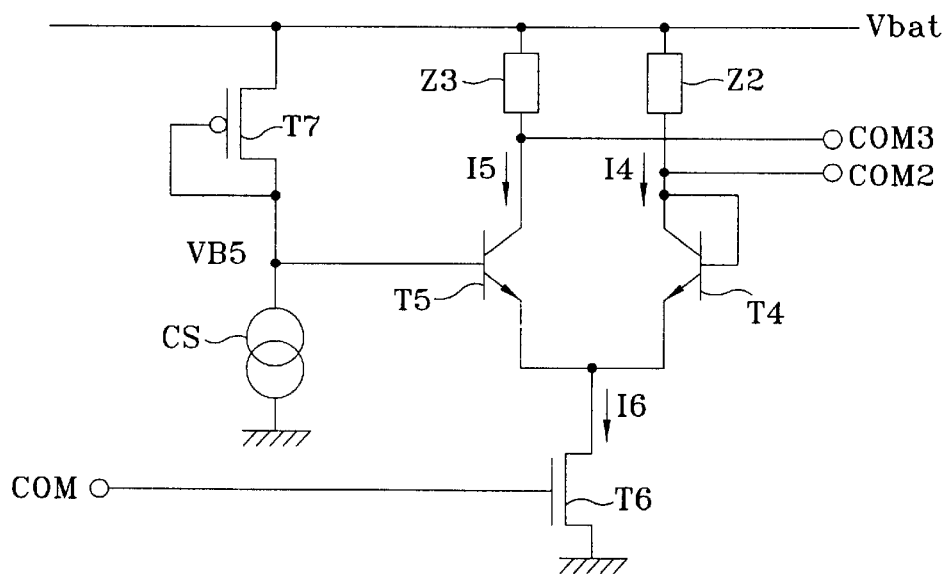
FIG. 4 schematically shows the control means of the voltage regulator of FIG. 3.

FIG. 4 schematically shows an embodiment of control means 4 of FIG. 3. Two impedances Z2 and Z3 each have a first terminal connected to supply voltage Vbat. Two bipolar transistors T4 and T5, of type NPN, have their collectors each connected to a second terminal respectively of impedances Z2 and Z3. The collectors of transistors T4 and T5 further are respectively connected to output terminals COM2 and COM3 of control means 4. The collector and the base of transistor T4 are interconnected. The base of transistor T5 is connected to a biasing means. The biasing means includes a P-channel MOS transistor T7 having its drain connected to the base of transistor T5. The source of transistor T7 is connected to voltage Vbat. The gate and the drain of transistor T7 are interconnected so that transistor T7 forms a diode. The drain of transistor T7 is further connected to voltage GND via a current source CS. In an alternative embodiment, the power supply voltage to the transistors T2 and T3 is different from the power supply voltage to the control means 4 and amplifier 2. The control circuit and amplifier may be connected to a Vdd, a regulated voltage output or a different value than Vbat. Similarly, the transistors T2 and T3 may be coupled to Vdd or some other value. The ground voltage reference for the amplifier 2 and supply 4 may be the same ground reference as for the load R, or alternatively, the ground reference voltage can be different, relative to each other.

The base of transistor T5 is submitted to a reference voltage VB5=Vbat−|VGS7|, where VGS7 is the voltage drop in the diode formed by transistor T7. Diode-mounted transistor T4 is run through by a current I4 when transistor T6 is on. The emitter of transistor T5 is submitted to a voltage VE5=Vbat−(Z2)×(I4)−VBE4, where VBE4 is the voltage drop in the diode formed by transistor T4 and (Z2)×(I4) is the voltage drop across the load Z2, which is the impedance multiplied by the current. The base-emitter voltage of transistor T5 is VBE5=(Z2)×(I4)+VBE4−|VGS7|. When current I4 is low, voltage VBE5 is smaller than the threshold voltage of transistor T5, and transistor T5 is off. When the regulator provides a low current IO, transistor T6, controlled by amplifier 2, is run through by a low current I6. Transistor T5 is off and I4=I6. When current IO provided by the regulator increases, currents I6 and I4 increase. When current I4 increases, voltage (Z2)×(I4) increases and voltage VBE5 increases to turn transistor T5 on. A current I5 then runs through transistor T5, with I6=I4+I5.

Impedance Z2 is chosen so that gate/source voltage VGS2 of transistor T2, where |VGS2|=Vbat−(Z2)×(I4), is adapted to turning transistor T2 on for a low value of current I4. Impedance Z3 is chosen so that gate/source voltage VGS3 of transistor T3, where |VGS31=Vbat−(Z3)×(I5), is adapted to turning transistor T3 on for a current I5 corresponding to a threshold value, $IO_s$, of current IO where $IO_s$ equals the standby current.

Figure 5:
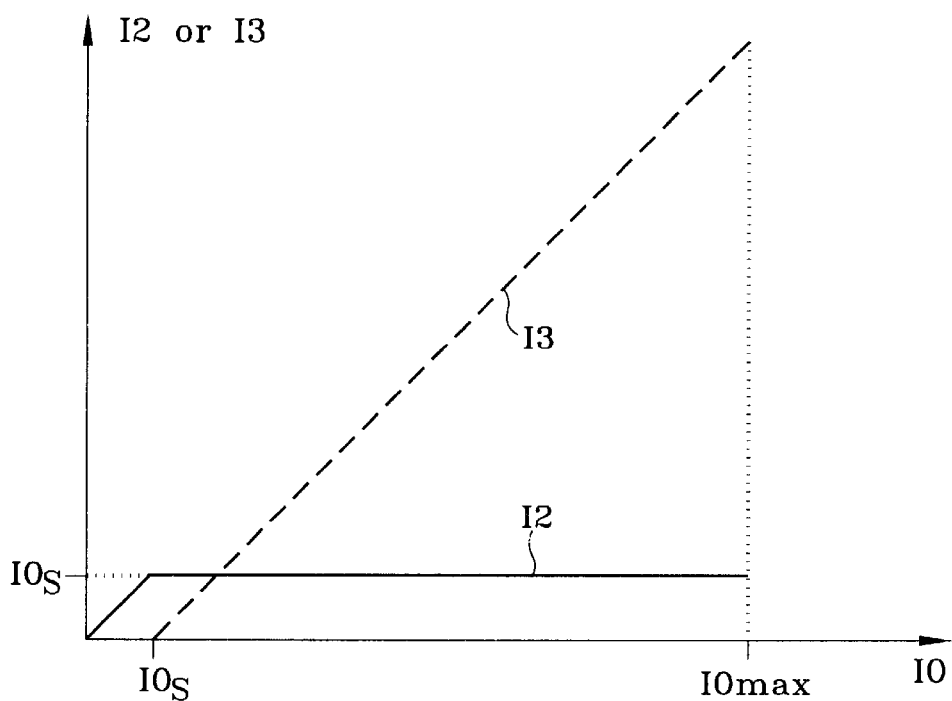
FIG. 5 illustrates the operation of the power transistors of the voltage regulator of FIG. 3.

FIG. 5 illustrates the value of currents I2 and I3 running through transistors T2 and T3 as a function of current IO. When IO is smaller than $IO_s$, only transistor T2 is on and current I2 equals IO As IO increases, the current I2 increases proportionally toward current $IO_s$. When current IO is greater than threshold current $IO_s$, transistor T3 comes on so that both transistors T2 and T3 are on. The elements of control means 4 are chosen so that current I2 remains substantially equal to IOS while current I3 increases proportionally to supply the needed current IO. The total current IO is equal to the sum of I2 and I3.

Figure 1:
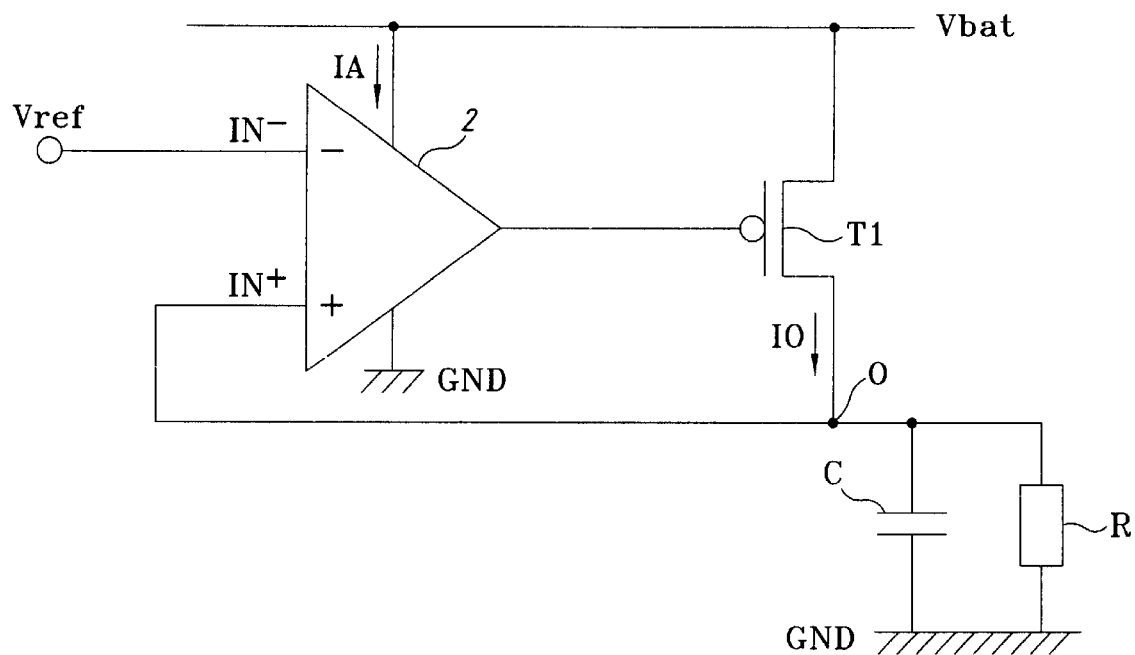
FIG. 1 previously described, schematically shows a conventional voltage regulator.

According to the present invention, current $IO_s$ is a sufficient current to power load R, for example when the circuits represented by load R are in a stand-by mode. Transistor T2, which is run through by a current smaller than or equal to $IO_s$, has a reduced size and a low gate capacitance as compared to transistor T3. When the regulator provides a low current, the current IA consumed by the amplifier to bias transistor T2 is reduced, which obtains a good efficiency of the regulator. Thus, when IO is smaller than $IO_s$, the response time is increased and power consumption of the regulator is reduced as a result of the reduced size and lower gate capacitance of T2. Transistor T3 carries a current smaller than or equal to $IOmax-IO_s$, where IOmax is the maximum current provided to load R by the regulator. Transistor T3 is larger and provides greater drive current capability than transistor T2, and thus has a larger gate capacitance. Transistor T3 is such that the current IA consumed by the amplifier to bias both transistors T2 and T3 is substantially equal to the current necessary to bias transistor T1 of FIG. 1. Thus, when IO is greater than $IO_s$, the regulator efficiency is substantially equal to the efficiency of a conventional regulator. The present circuit thus has the advantage of providing a high current capability according to the needs of the load during heavy operational use, while providing increased circuit efficiency, improved stability and faster response time during low current consumption.

Figure 2:
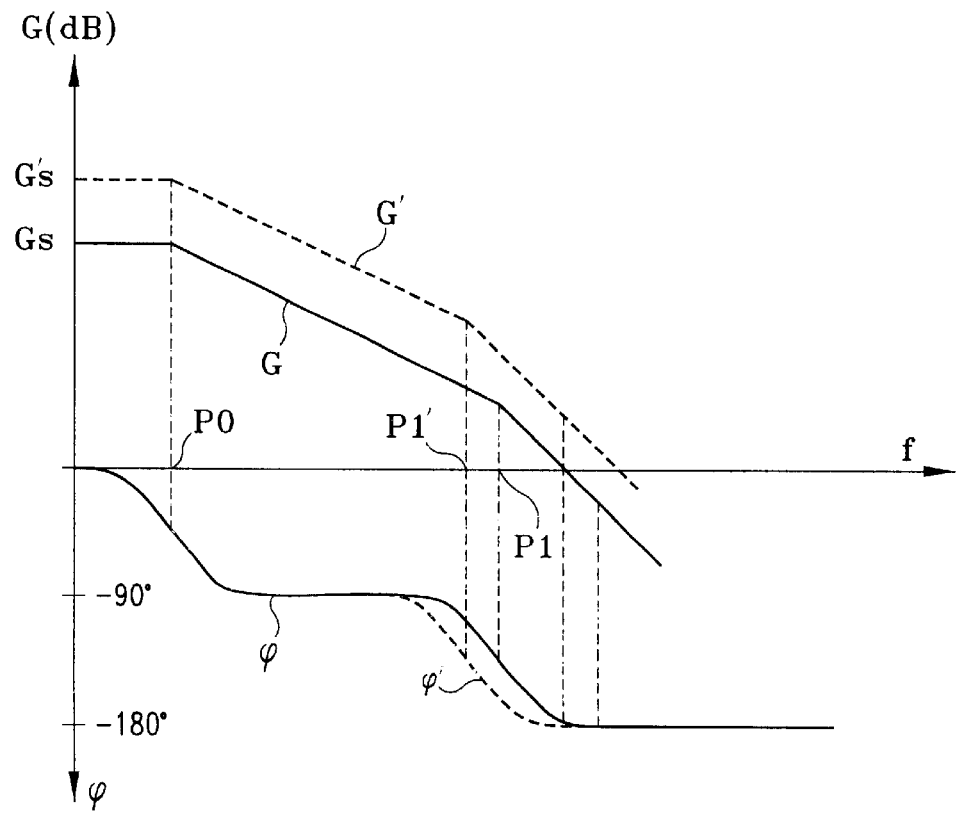
FIG. 2 previously described, illustrates the operation of the voltage regulator of FIG. 1.
Figure 6:
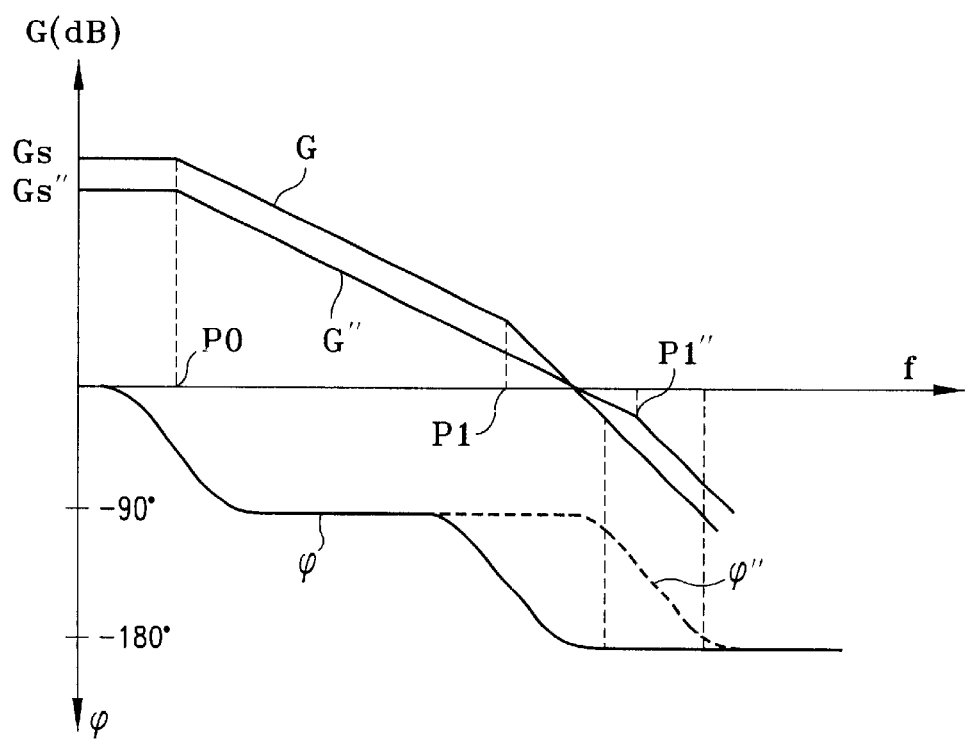
FIG. 6 illustrates the operation of the voltage regulator of FIG. 3.

FIG. 6 schematically shows open-loop gain G and phase φ of the regulator according to the present invention when transistors T2 and T3 are on. The gates of transistors T2 and T3 are controlled in parallel. Transistors T2 and T3 are selected so that the sum of their gate capacitances introduces a secondary pole having substantially the same frequency P1 as in FIG. 2. Further, the gains of transistors T2 and T3 depending on the W/L ratios of transistors T2 and T3, are selected so that the open-loop regulator static gain is substantially equal to static gain Gs of FIG. 2. When transistors T2 and T3 are on, the regulator according to the present invention has the same stability as a conventional regulator. FIG. 6 also illustrates open-loop gain G" and phase φ" of the regulator according to the present invention when only transistor T2 is on. The gate capacitance of transistor T2 is low, which results in shifting the secondary pole towards a frequency P1" greater than previous frequency P1, which improves the regulator stability. Further, the static gain of the open-loop regulator, which depends on the W/L ratio of transistor T2, has a value Gs" smaller than previous gain Gs, which also improves the regulator stability. A regulator according to the present invention thus exhibits an improved stability when it provides a low current.

Of course, the present invention is likely to have various alterations, modifications, and improvements which will readily occur to those skilled in the art. As an example, the present invention has been described in relation with a voltage regulator using MOS power transistors T2 and T3, but those skilled in the art will easily adapt the present invention to a voltage regulator using another type of voltage-controlled power switch.

The present invention has been described in relation with a specific biasing means of transistor T5, but those skilled in the art will easily adapt the present invention to other biasing means, for example, a conventional reference voltage source.

The present invention has been described in relation with positive voltages Vbat and Vref, but those skilled in the art will easily adapt the present invention to negative voltages Vbat and Vref, by inverting the types of the described MOS transistors and by replacing the NPN-type bipolar transistors by PNP-type transistors.

For simplicity, the present invention has been described in relation with a resistive load R, but those skilled in the art will easily adapt the present invention to a complex load.

For simplicity, the present invention has been described in relation with a voltage regulator using a non-resistive feedback loop and providing a voltage equal to a received reference voltage Vref. However, those skilled in the art will easily adapt the present invention to a voltage regulator in which the feedback loop includes a resistive bridge, and which outputs a voltage different from received voltage Vref.

The present invention has been described in relation with an open-loop regulator, the open-loop transfer function of which includes a main pole and a secondary pole, but those skilled in the art will easily adapt the present invention to an open-loop regulator having a different open-loop transfer function, for example including zeros and having a greater number of poles.

Such alterations, modifications, and improvements are intended to be part of this disclosure, and are intended to be within the spirit and the scope of the present invention. From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A voltage regulator having an output terminal connected to a load, comprising:

an amplifier having an inverting input connected to a reference voltage, and a non-inverting input connected to the output terminal;

a charge capacitor arranged between the output terminal and a first supply voltage;

a first and second voltage-controlled switches each arranged to apply directly a second supply voltage to the output terminal; and a control means adapted to provide a voltage depending on the output voltage of the amplifier to the gate of the first switch and, when the current flowing through the first switch reaches a predetermined threshold, to the gate of the second switch.

2. The voltage regulator of claim 1, wherein the current running through the first switch is smaller than or equal to said predetermined threshold.

3. The voltage regulator of claim 1, wherein the amplifier is supplied between the first supply voltage and the second supply voltage.

4. The voltage regulator of claim 1, wherein the first and second voltage switches are MOS transistors of a first type, the gate of the second switch being wider than the gate of the first switch.

5. The voltage regulator of claim 4, wherein the control means comprises:

a first and second impedances, a first terminal of each impedance being connected to the second supply voltage;

a first and second bipolar transistors having collectors connected to a second terminal respectively of the first and second impedances, and to the gates respectively of the first and second switches, the base and the collector of the first transistor being interconnected, the base of the second transistor being connected to the first supply voltage via a current source;

a third MOS transistor of a second type arranged to connect the emitters of the first and second transistors to the first supply voltage, the gate of the third transistor being connected to the output of the amplifier; and a fourth diode-connected MOS transistor of the first type, arranged to connect the base of the second transistor to the second supply voltage.

6. The voltage regulator of claim 4, wherein the first and second switches and the fourth transistor are P-channel MOS transistors, the first and second bipolar transistors are of NPN type, and the third transistor is an N-channel MOS transistor.

7. A voltage regulator comprising:

an output terminal of the voltage regulator;

an amplifier circuit having an inverting input terminal coupled to a reference voltage source, a noninverting input terminal coupled to the output terminal of the voltage regulator, and an output terminal;

a control circuit having an input terminal coupled to the output terminal of the amplifier circuit, and first and second output terminals;

a first voltage controlled switch having an input terminal coupled to the first supply voltage, an output terminal coupled to the output terminal of the voltage regulator, and a control terminal coupled to the first output terminal of the control circuit;

a second voltage controlled switch having an input terminal coupled to the first supply voltage, an output terminal coupled to the output terminal of the voltage regulator, and a control terminal coupled to the second output terminal of the amplifier circuit; and a capacitor coupled to the output terminal of the voltage regulator.

8. A voltage regulator according to claim 7 wherein the amplifier circuit is an operational amplifier.

9. A voltage regulator according to claim 7 wherein the control circuit comprises:

a first transistor of a first type having a control terminal coupled to the output terminal of the amplifier circuit, an output terminal coupled to a supply voltage, and an input terminal;

a second transistor of a second type having a control terminal, an input terminal coupled to the control terminal and coupled to the control terminal of the first voltage controlled switch, and an output terminal coupled to the input of the first transistor;

a third transistor of a second type having a control terminal, an input terminal coupled to the control terminal of the second voltage controlled switch, and an output terminal coupled to the input terminal of the first transistor;

a fourth transistor of a third type having a control terminal, an input terminal coupled to a supply voltage, an output terminal coupled to the control terminal of the fourth transistor and coupled to the control terminal of the third transistor;

a current source coupled to the output terminal of the fourth transistor;

a first impedance coupled between a supply voltage and the input terminal of the second transistor; and a second impedance coupled between a supply voltage and the input of the third transistor.

10. A voltage regulator according to claim 7 wherein the first voltage controlled switch is limited to a current less than or equal to a predetermined threshold current.

11. A voltage regulator according to claim 7 wherein the first and second voltage controlled switches comprises a first and second PMOS transistors.

12. A voltage regulator according to claim 11 wherein the second voltage controlled switch has a larger gate width than the first voltage controlled switch.

13. A voltage regulator according to claim 12 wherein the first voltage controlled switch has a lower gate capacitance than the second voltage controlled switch.

* * * * *